US012665594B2

(12) United States Patent
Pigott et al.

(10) Patent No.: US 12,665,594 B2
(45) Date of Patent: Jun. 23, 2026

(54) PROTECTION STRUCTURE FOR AN ENHANCEMENT-MODE FET OF A CIRCUIT AND CORRESPONDING METHOD

(71) Applicant: NXP USA, INC., Austin, TX (US)

(72) Inventors: John Pigott, Phoenix, AZ (US); Vishnu Khemka, Chandler, AZ (US); Tanuj Saxena, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 6 days.

(21) Appl. No.: 18/819,313

(22) Filed: Aug. 29, 2024

(65) Prior Publication Data

US 2025/0096799 A1 Mar. 20, 2025

(30) Foreign Application Priority Data

Sep. 15, 2023 (EP) ..................................... 23197729

(51) Int. Cl.
H03K 17/687 (2006.01)
H03K 17/74 (2006.01)
H10D 84/80 (2025.01)

(52) U.S. Cl.
CPC ......... H03K 17/6871 (2013.01); H03K 17/74 (2013.01); H10D 84/811 (2025.01); *H03K 2017/6875* (2013.01)

(58) Field of Classification Search
CPC ...... H02M 1/32; H02M 1/08; H02M 3/33507; H02M 1/36; H01L 2924/00; H01L 2924/0002; H01L 2924/00014; H01L 2224/48091; H01L 2924/13091; H03K 17/0822; H03K 17/687; H03K 17/08122; H03K 17/0828; H03K 17/063;
(Continued)

(56) References Cited

U.S. PATENT DOCUMENTS

| | | | |
|---|---|---|---|
| 5,631,187 A | 5/1997 | Phipps et al. | |
| 8,643,990 B2 * | 2/2014 | Cao ........................ | H02H 9/046 361/91.1 |
| 2009/0219657 A1 | 9/2009 | Hshieh | |

(Continued)

OTHER PUBLICATIONS

Haehre, K., "Switching Speed-Control of an Optimized Capacitor-Clamped Normally-On Silicon Carbide JFET Cascode", 15th International Power Electronics and Motion Control Conference, EPE-PEMC 2012 ECCE Europe, Sep. 4-6, 2012.
(Continued)

*Primary Examiner* — Diana J. Cheng

(57) ABSTRACT

The present invention relates to a circuit comprising a self-conducting transistor referred to as power transistor, a further transistor referred to as control transistor, a further transistor referred to as first protection transistor, and a string referred to as a Zener string, which comprises at least one Zener diode, wherein the power transistor is coupled between a first terminal of the circuit and a first node of the circuit, wherein the control transistor is coupled between the first node and a second terminal of the circuit, wherein a gate terminal of the control transistor is coupled to a third terminal of the circuit, wherein the first protection transistor is coupled between the first node and the second terminal, and wherein the Zener string is coupled between the first terminal and a gate terminal of the first protection transistor.

18 Claims, 7 Drawing Sheets

(58) Field of Classification Search
CPC ... H03K 2017/0806; H03K 2217/0081; H03K
17/567; H03K 17/6871
See application file for complete search history.

(56)                    References Cited

U.S. PATENT DOCUMENTS

2015/0084685 A1     3/2015  Hirose et al.
2015/0270255 A1     9/2015  Ikeda et al.

OTHER PUBLICATIONS

Kim, J., "Electrical Characteristic of Power MOSFET with Zener
Diode for Battery Protection IC", Transaction on Electrical and
Electronic Materials, vol. 14, No. 1, pp. 47-51, Feb. 25, 2013.
Shen, Z.J., "High Voltage Clamped IGBT for Automotive Ignition
Applications", Proceedings of 1998 International Symposium on
Power Semiconductor Devices & IC's, Kyoto, downloaded from the
Internet Jun. 6, 2023.

* cited by examiner

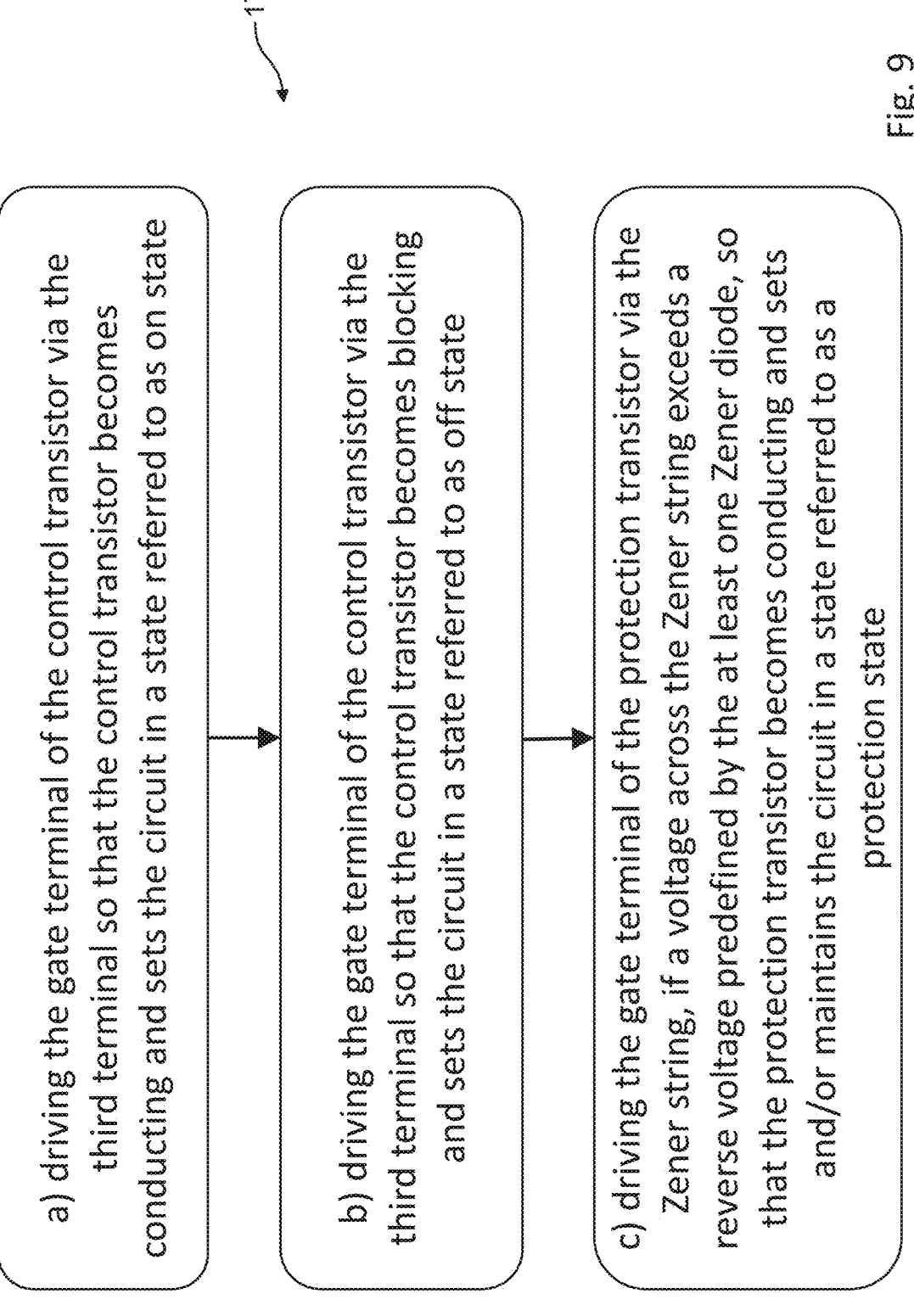

a) driving the gate terminal of the control transistor via the third terminal so that the control transistor becomes conducting and sets the circuit in a state referred to as on state b) driving the gate terminal of the control transistor via the third terminal so that the control transistor becomes blocking and sets the circuit in a state referred to as off state c) driving the gate terminal of the protection transistor via the Zener string, if a voltage across the Zener string exceeds a reverse voltage predefined by the at least one Zener diode, so that the protection transistor becomes conducting and sets and/or maintains the circuit in a state referred to as a protection state

PROTECTION STRUCTURE FOR AN ENHANCEMENT-MODE FET OF A CIRCUIT AND CORRESPONDING METHOD

CROSS-REFERENCE TO RELATED APPLICATIONS

This application claims the priority under 35 U.S.C. § 119 of European Patent application no. 23197729.9, filed on 15 Sep. 2023, the contents of which are incorporated by reference herein.

TECHNICAL FIELD

The present disclosure relates to a circuit and a method for a circuit.

BACKGROUND

An inverter may be used to convert a DC voltage to an AC voltage. The inverter may comprise a half bridge or a full bridge circuit, for example in an H configuration. The full bridge circuit may comprise four electronically controllable switch units. Each switch unit may comprise at least one transistor. The switch units may be controlled via a control unit so that an AC voltage can be generated from a DC voltage, or vice versa, via the full bridge circuit. For example, the inverter can be used for solar panels to generate an AC voltage from a DC voltage of the solar panels. In another example, the inverter may be used to power an electric motor of an electric vehicle.

The load at the output of the inverter often has an inductive component, a capacitive component, and an impedance component. The inductive component of the load can lead to the technical effect that an electric current continues to flow through the load at the output of the inverter even after the switch units of the inverter are switched off, at least for a short moment. Due to the aforementioned technical effect, very high electrical voltages may be dropped across the switch units of the inverter. In this regard, it is desirable that the inverter be robust to such high electrical voltages.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

Aspects of the disclosure are defined in the accompanying claims.

In accordance with a first aspect of the present disclosure, a circuit is provided. The circuit comprising: a self-conducting transistor referred to as power transistor, a further transistor referred to as control transistor, a further transistor referred to as first protection transistor, and a string referred to as a Zener string, which comprises at least one Zener diode, wherein the power transistor is coupled between a first terminal of the circuit and a first node of the circuit, wherein the control transistor is coupled between the first node and a second terminal of the circuit, wherein a gate terminal of the control transistor is coupled to a third terminal of the circuit, wherein the first protection transistor is coupled between the first node and the second terminal, and wherein the Zener string is coupled between the first terminal and a gate terminal of the first protection transistor.

In one or more embodiments, the power transistor is a gallium nitride transistor, a silicon carbide transistor or another compound semiconductor transistor.

In one or more embodiments, the control transistor and the first protection transistor are monolithic.

In one or more embodiments, the control transistor, the first protection transistor and the at least one Zener diode are monolithic.

In one or more embodiments, the drain terminal of the power transistor is coupled to the first terminal, and wherein the source terminal of the power transistor is coupled to the first node.

In one or more embodiments, the gate terminal of the power transistor is coupled to the second terminal.

In one or more embodiments, the drain terminal of the control transistor is coupled to the first node, and wherein a source terminal of the control transistor is coupled to the second terminal.

In one or more embodiments, at least one of the control transistor and the first protection transistor is a self-blocking transistor, in particular a silicon, Si, self-blocking transistor.

In one or more embodiments, the drain terminal of the first protection transistor is coupled to the first node, and wherein the source terminal of the first protection transistor is coupled to the second terminal.

In one or more embodiments, the source terminal of the first protection transistor is coupled to the second terminal via at least a first electrical impedance.

In one or more embodiments, the gate terminal of the first protection transistor is coupled to the second terminal at least via a second electrical impedance.

In one or more embodiments, the circuit comprises a further transistor referred to as second protection transistor, wherein the second protection transistor is coupled between the first node and the second terminal, and wherein the gate terminal of the second protection transistor is coupled to the source terminal of the first protection transistor.

In one or more embodiments, the drain terminal of the second protection transistor is coupled to the first node, and wherein the source terminal of the second protection transistor is coupled to the second terminal.

In one or more embodiments, the second protection transistor is a self-blocking transistor, in particular a self-blocking silicon, Si, transistor.

In accordance with a second aspect of the present disclosure, a method for a circuit comprising a self-conducting power transistor, a further transistor referred to as control transistor, a further transistor referred to as first protection transistor, and a string referred to as Zener string comprising at least one Zener diode, wherein the power transistor is a gallium nitride transistor or a silicon carbide transistor, wherein the power transistor is coupled between a first terminal of the circuit and a first node of the circuit, wherein the control transistor is coupled between the first node and a second terminal of the circuit, wherein a gate terminal of the control transistor is coupled to a third terminal of the circuit, wherein the first protection transistor is coupled between the first node and the second terminal, and wherein the Zener string is coupled between the first terminal and a gate terminal of the first protection transistor, and wherein the method comprises the steps of: (a) driving the gate terminal of the control transistor via the third terminal so that the control transistor becomes conducting and sets the circuit in a state referred to as on state, (b) driving the gate terminal of the control transistor via the third terminal so that the control transistor becomes blocking and sets the circuit in a state referred to as off state, and (c) driving the gate terminal of the protection transistor via the Zener string, if a voltage across the Zener string exceeds a reverse voltage predefined by the at least one Zener diode, so that the protection transistor becomes conducting and sets and/or maintains the circuit in a state referred to as a protection state.

In accordance with a third aspect of the present disclosure, a device is disclosed, which comprises the circuit of the first aspect of the present disclosure. The device may be an integrated circuit device.

DESCRIPTION OF DRAWINGS

Embodiments of the present disclosure will be described in more detail with reference to the appended drawings. It is to be noted, however, that the appended drawings illustrate only typical embodiments of the present disclosure and are therefore not to be considered limiting of its scope, such that other equally effective embodiments may be implemented. Advantages of the subject matter claimed will become apparent to those skilled in the art upon reading this description in conjunction with the accompanying drawings, in which like reference numerals have been used to designate like elements, and in which:

FIG. 9 shows a simplified flow chart.

DESCRIPTION OF EMBODIMENTS

Figure 1:
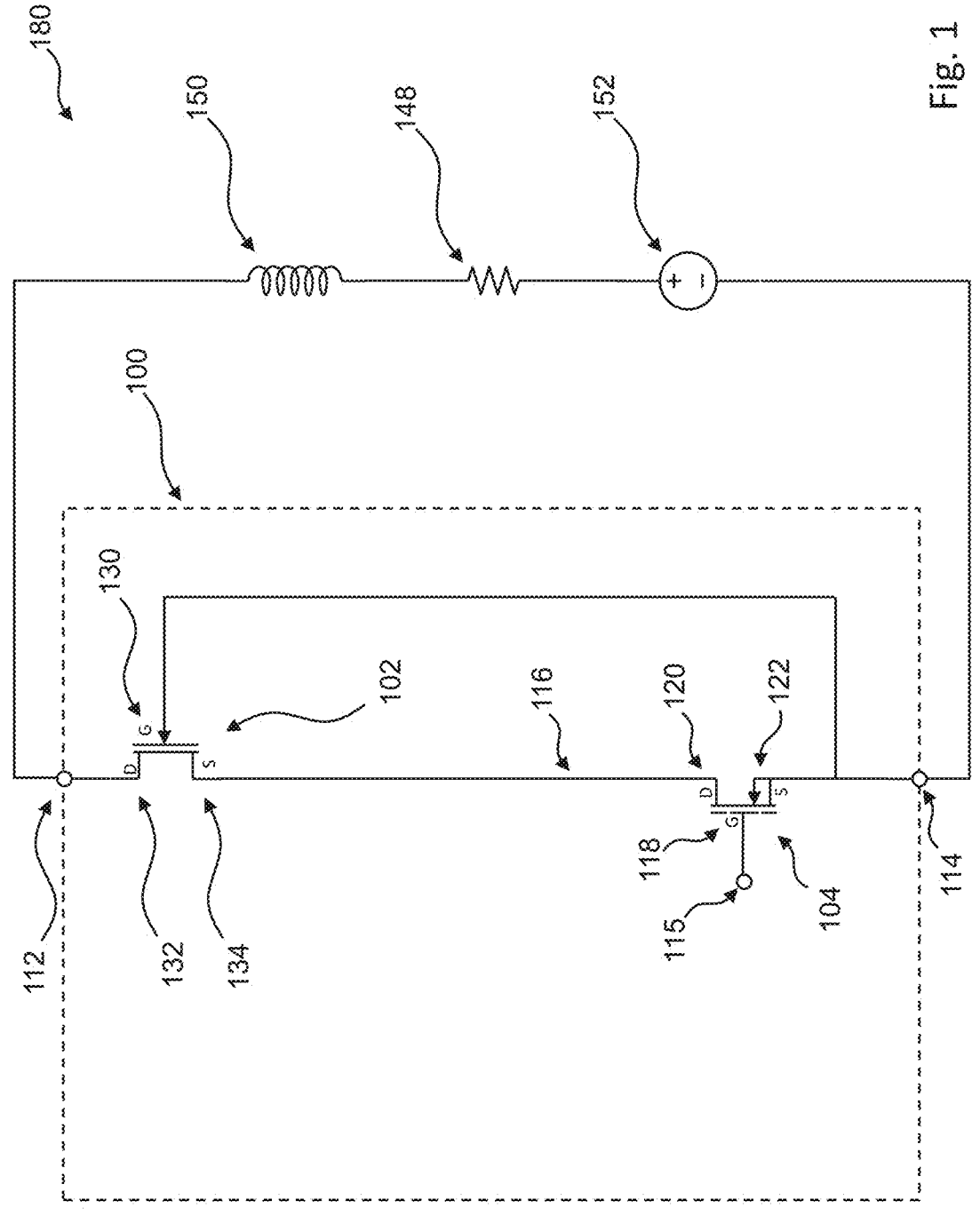
FIG. 1 shows a simplified block diagram of a circuit.

FIG. 1 schematically illustrates an example embodiment of a circuit 100. In an example, the circuit 100 may be understood as a device. The circuit 100 comprises a transistor 102, referred to as the power transistor 102, another transistor 104, referred to as the control transistor 104, and still another transistor 106, referred to as the first protection transistor 106.

The power transistor 102 may be a self-conducting transistor. Further, the power transistor 102 may be configured as a field effect transistor, FET. In an example, the power transistor 102 is configured and/or referred to as a depletion type transistor or a depletion FET. The power transistor 102 may also be referred to as a "normally on" transistor. In an example of the self-conducting transistor electrical conductivity between the source terminal 134 of the power transistor 102 and the drain terminal of the power transistor 102 is possible even without a (positive) gate voltage. A drain-source voltage between the drain terminal 132 and the source terminal 134 may be sufficient to provide an electrical current between the drain terminal and the source terminal. In an example, the self-conducting transistor is configured to block an electrical current between the drain terminal 132 and the source terminal 134 if a gate voltage at the gate terminal 130 is lower than a source voltage at the source terminal 134. As a result, an electric current between the drain terminal 132 and the source terminal 134 of the power transistor 102 can be controlled by the gate voltage at the gate terminal 130 and/or by the source voltage at the source terminal 134.

Figure 8:
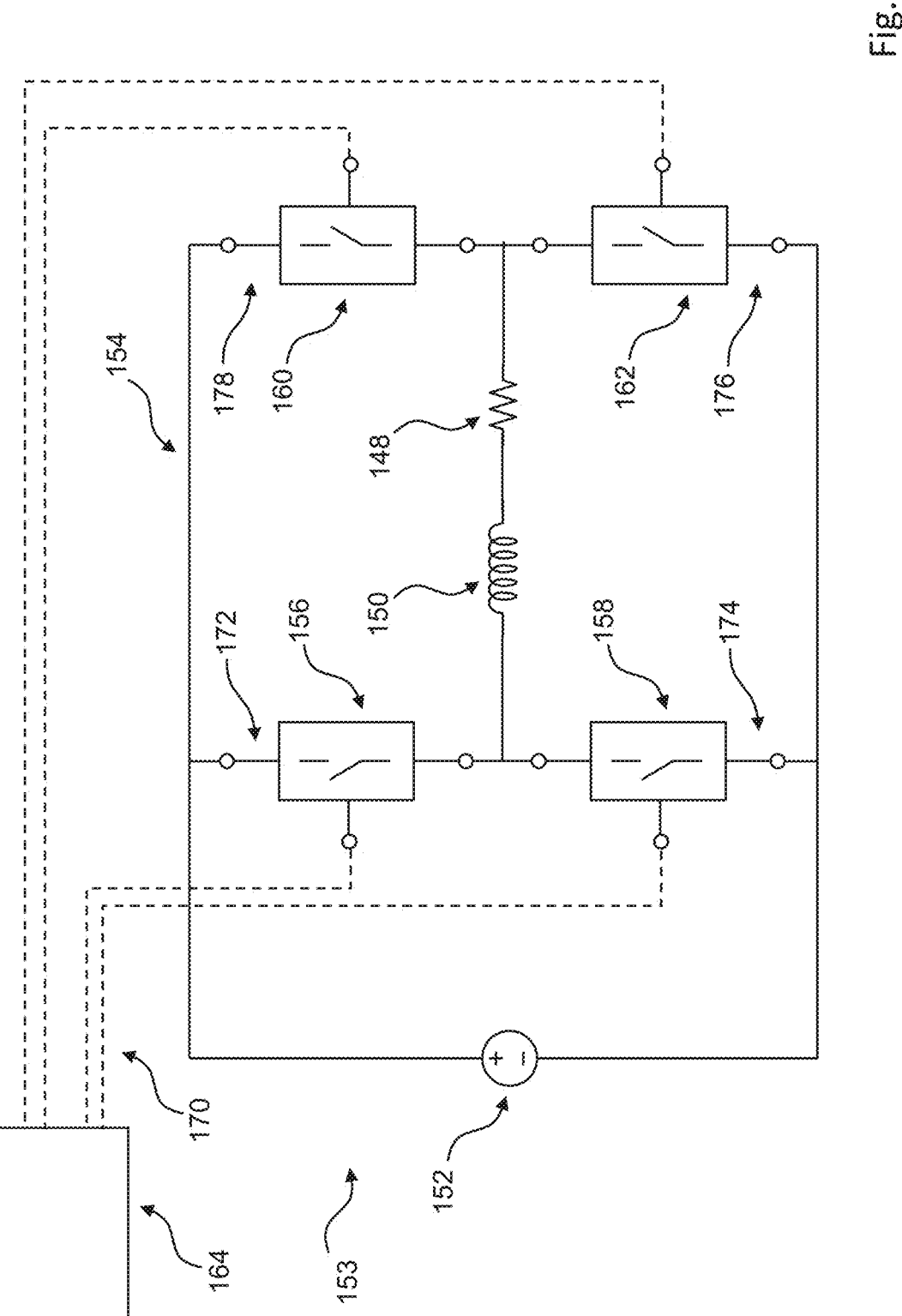
FIG. 8 shows a simplified block diagram of a system according to the present disclosure.

The power transistor 102 is coupled between a first terminal 112 of the circuit 100 and a first node 116 of the circuit 100. The first terminal 112 may be configured as a terminal of the circuit 100 or as another node of the circuit 100. In one example, the circuit 100 may form part of a larger circuit (not shown) such that the circuit 100 may be integrated into the larger circuit. In another example, the circuit 100 may be comprised of a device used in an example as a switch unit. In this example, the first terminal 112 may form a terminal of the switch unit. In FIG. 8, an example of a device 153 is shown schematically. The device 153 may form part of an inverter. The device 153 comprises a bridge circuit 154, which is configured in particular as a full bridge and/or as an H-bridge. The bridge circuit 154 may comprise a plurality of legs 172, 174, 176, 178. Further, the bridge circuit 154 may comprise a plurality of switch units 156, 158, 160, 162. Each leg 172, 174, 176, 178 may include one of the switch units 156, 158, 160, 162. Each switch unit 156, 158, 160, 162 may be formed by a circuit according to the circuit 100.

In an example, a coupling may be understood as a direct electrical connection or an indirect electrical connection, in particular via at least one other electrical component, such as an electrical resistor, an electrical capacitor and/or an electrical inductor. If the indirect electrical connection is used, in an example several components may be electrically connected to each other in a predefined circuit arrangement. A direct electrical connection or an indirect electrical connection may comprise parasitic components.

The control transistor 104 may be a self-blocking transistor, particularly a silicon self-blocking transistor. Further, the control transistor 104 may be configured as a field effect transistor. In an example, the control transistor 104 is configured and/or referred to as an enhancement type transistor or an enhancement FET. The control transistor 104 may also be referred to as a "normally off" transistor. In an example, the control transistor 104 is configured so that no conduction electrons (or conduction carriers) are available without a positive gate voltage at the gate terminal 118 of the control transistor 104. In other words, without the positive gate voltage at the gate terminal 118 of the control transistor 104, no electrical conductivity (and/or conductive channel) is established between the drain terminal 120 and the source terminal 122 of the control transistor 104. Without the positive gate voltage applied to the gate terminal 118 of the control transistor 104, the control transistor 104 turns off. On the other hand, if a positive gate voltage is applied to the gate terminal 118 of the control transistor 104, a conductive channel is formed between the drain terminal 120 and the source terminal 122. As a result, an electric current may flow between the drain terminal 120 and the source terminal 122 via the conductive channel.

The control transistor 104 is coupled between the first node 116 and a second terminal 114 of the circuit 100. The second terminal 114 may be configured as another terminal of the circuit 100 or as another node of the circuit 100. As previously discussed, in an example, the circuit 100 may be comprised of a device, such as a switch unit. The switch unit may be a switch unit 156, 158, 160, 162 of the bridge circuit 154. The bridge circuit 154 may form a part of the device 153. In this regard, reference is made to the preceding explanations and to FIG. 8. In this example, the second terminal 114 may also form a terminal of a switch unit 156, 158, 160, 162.

The circuit 100 further comprises a third terminal 115. The gate terminal 118 of the control transistor 104 is coupled to the third terminal 115. The third terminal 115 may be configured as another terminal of the circuit 100 or as another node of the circuit 100. In an example, the third terminal 115 may also form a terminal of a switch unit 156, 158, 160, 162.

In an example, the control transistor 104 is coupled to the power transistor 102 via the first node 116 such that the control transistor 104 can control a gate-source voltage between the gate terminal 130 of the power transistor 102 and the source terminal 134 of the power transistor 102. The control transistor 104 is controllable via the gate terminal 118 and, therefore, via the third terminal 115. As an effect, the gate-source voltage between the gate terminal 130 of the power transistor 102 and the source terminal 134 of the power transistor 102 can be controlled at least indirectly via the third terminal 115.

In an example, the drain terminal 132 of the power transistor 102 is coupled to the first terminal 112. The drain terminal 132 may be electrically connected directly to the first terminal 112 via a signal connection.

The source terminal 134 of the power transistor 102 may be coupled to the first node 116 of the circuit 100. Further, the drain terminal 120 of the control transistor 104 may be coupled to the first node 116 circuit 100. In an example, the source terminal 134 of the power transistor 102 may be directly coupled to the first node 116 via a signal connection. In addition, the drain terminal 120 may be directly coupled to the node 116 via a signal connection. The signal connection from the source terminal 134 to the first node 116 and the signal connection from the node 116 to the drain terminal 120 may be configured as a common signal connection comprising the first node 116.

In an example, the source terminal 122 of the control transistor 104 is coupled to the second terminal 114. The source terminal 122 may be electrically connected directly to the second terminal 114 via a signal connection.

In an example, the gate terminal 130 of the power transistor 102 is coupled to the second terminal 114. The gate terminal 130 of the power transistor 102 may be directly electrically connected to the second terminal 114 via a signal connection. As a result, both the source terminal 122 of the control transistor 104 and the gate terminal 130 of the power transistor 102 may be directly connected to the second terminal 114 via respective signal connections. The signal connections may be at least partially formed together.

In an example, the control transistor 104 may be controlled via the third terminal 115 to set the control transistor 104 in a conductive state in which a conductive connection is configured between the drain terminal 120 of the control transistor 104 and the source terminal 122 of the control transistor 104. As an effect, the gate-source voltage between the gate terminal 130 and the source terminal 134 decreases to approximately 0 V or a value that causes the self-conducting power transistor 102 to be set in a conductive state in which a conductive connection is configured between the drain terminal 132 and the source terminal 134. As another effect, both the power transistor 102 and the control transistor 104 are in a conductive state such that, in an example, the circuit 100 is set in a conductive state in which a conductive connection is configured between the first terminal 112 and the second terminal 114. In an example, the circuit 100 may be controlled to set the circuit 100 in the conductive state via the third terminal 115. For example, if a voltage is generated at the third terminal 115 that is greater than a voltage at the second terminal 114, then a positive gate-source voltage is caused between the gate terminal 118 and the source terminal 122 of the control transistor 104. The positive gate-source voltage causes the control transistor 104 to conduct at least if the positive gate-source voltage is greater than a predefined threshold voltage.

In an example, the control transistor 104 may be controlled via the third terminal 115 to set the control transistor 104 in a blocking state in which electrical current flow between the drain terminal 120 and the source terminal 122 is prevented. As an effect, in an example, a negative gate-source voltage may be generated between the gate terminal 130 and the source terminal 134 of the power transistor 102 such that the power transistor 102 is set in a blocking state in which electrical current flow between the drain terminal 132 and the source terminal 134 of the power transistor 102 is prevented.

Figures 5, 6, 7:
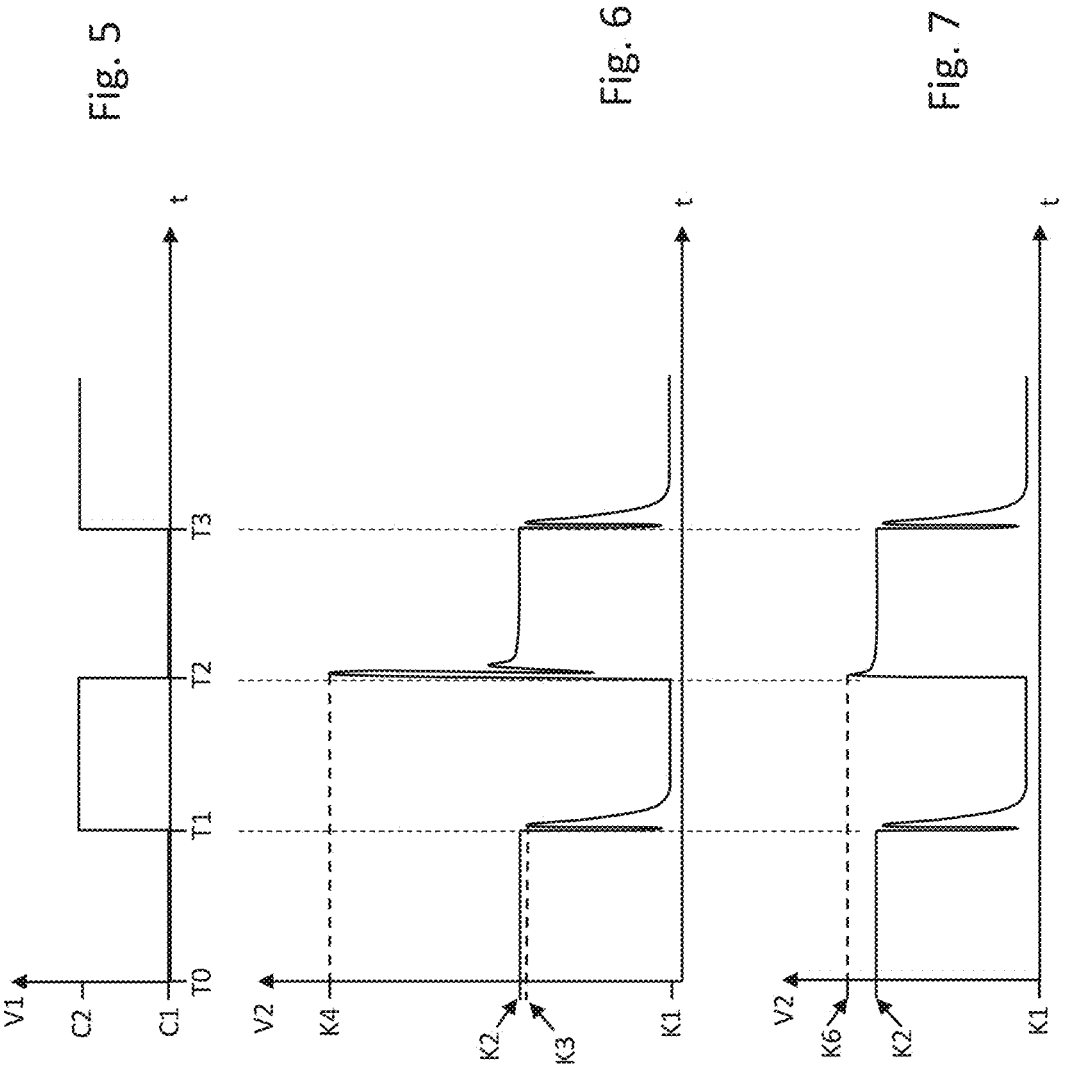
FIGS. 5 to 7 each show a simplified signal flow.

In FIG. 5, an example of a signal waveform of a voltage referred to as a control voltage V1 is schematically shown. The control voltage V1 is applied to the third terminal 115. At time T0, the control voltage V1 has a value of C1, so that the control transistor 104 is in a blocking state. In an example, the value C1 of the control voltage V1 may be less than a predefined threshold voltage of the control transistor 104. In an example, the power transistor 102 is controlled by the control transistor 104 such that the power transistor 102 is also in the blocking state.

In FIG. 6, an example of a waveform of a voltage referred to as transistor voltage V2 is schematically shown, which is between the drain terminal 132 and the source terminal 134 of the power transistor 102. At time T0, the transistor voltage has a value K2.

In addition to schematically illustrating an example embodiment of the circuit 100, FIG. 1 also illustrates an example in which the circuit 100 is included in an example of a larger circuit arrangement 180. In the example, the circuit arrangement 180 comprises the circuit 100, an inductor 150 referred to as load inductor 150, an impedance 148 referred to as load impedance 148, and a voltage source 152. The load inductor 150, the load impedance 148, and the voltage source 152 are coupled in series between the first terminal 112 of the circuit 100 and the second terminal 114 of the circuit 100.

The time points T0, T1, T2, T3 indicated in FIG. 5 apply analogously to time points in FIGS. 6 and 7. Previously, it was explained that the control transistor 104 and the power transistor 102 are each in the blocking state at time point T0. As an effect, the transistor voltage V2 at time point T0 will have the value K2, which in an example is at least 80% of the voltage of the voltage source 152. The value of the voltage of the voltage source 152 may be 600 V. If both, the control transistor 104 and the power transistor 102 are each in the blocking state at time T0, the transistor voltage V2 may have 500 V (as the value K2) at time T0, for example.

At time T1, the control voltage V1 changes from the value C1 to the value C2, which is preferably greater than the predefined threshold voltage of the control transistor 104. As an effect, the control transistor 104 changes from the blocking state to the conducting state in which an electrically conducting channel is formed between the drain terminal 120 and the source terminal 122. As another effect, the power transistor 102 changes from the blocking state to the conducting state, forming a conducting channel between the drain terminal 132 and the source terminal 134. Due to the rapid transition of the control voltage V1 from the value C1 to the value C2, an oscillatory behavior of the transistor voltage V2 occurs immediately at and following the time T1. This oscillation behavior is caused, for example, by the load inductance 150. Due to the oscillation behavior, the transistor voltage V2 can have the value K3, at least for a short time following the time T1. After a short transition phase following the time T1, the transistor voltage V2 reaches the value K1. The value K1 is clearly smaller than the value K2.

At time T2, the control voltage V1 changes from the value C2 to the value C1, which is preferably smaller than the predefined threshold voltage of the control transistor 104. As an effect, the control transistor 104 changes from the conducting state to the blocking state in which current flow between the drain terminal 120 and the source terminal 122 is prevented. As another effect, the power transistor 102 changes from the conductive state to the blocking state, preventing current flow between the drain terminal 132 and the source terminal 134. Due to the fast transition of the control voltage from the value C2 to the value C1, there is a (further) oscillation of the transistor voltage V2 immediately at and following the time T2. This (further) oscillation behavior is caused, for example, by the load inductance 150. Due to the (further) oscillation behavior, the transistor voltage V2 can have the value K4, which is significantly greater than the value K2 and/or greater than the value K3, at least for a short time following the time C2. After a short transition phase following the time T2, the transistor voltage V2 reaches the value K2.

The value K4 of the transistor voltage V2 causes a high stress on the power transistor 102. In particular, therefore, measures are necessary to prevent an avalanche breakthrough in the power transistor 102 if the transistor voltage V2 has the value K4. However, these measures result in increased cost as well as a larger size of the power transistor 102. Both the increased cost and the larger size are undesirable and are to be avoided.

Figure 2:
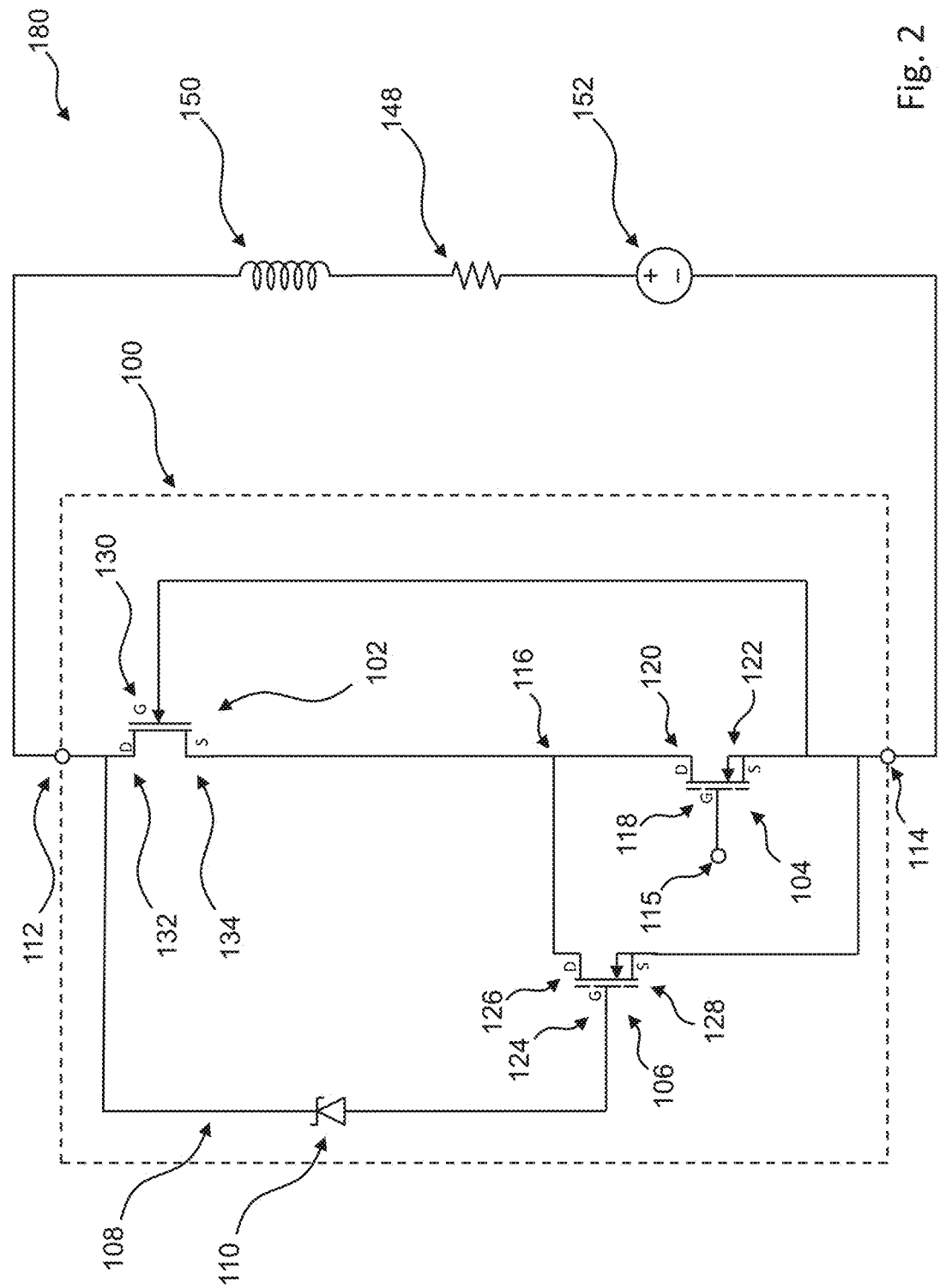
FIGS. 2 to 4 each show a simplified block diagram of circuit according to the present disclosure.

According to the present disclosure, it is therefore provided that the circuit 100 comprises a string 108 referred to as the Zener string 108 and a further transistor 106 referred to as the first protection transistor 106. An example of an embodiment of the circuit 100 is schematically shown in FIG. 2.

The first protection transistor 106 is coupled between the first node 116 and the second terminal 114. In an example, a drain terminal 126 of the protection transistor 106 is directly or indirectly connected to the first node 116. The source terminal 128 of the first protection transistor 106 may be directly or indirectly connected to the second terminal 114.

The first protection transistor 106 may be a self-blocking transistor, in particular a silicon self-blocking transistor. Further, the first protection transistor 106 may be configured as a field effect transistor. In an example, the first protection transistor 106 is configured and/or referred to as an enhancement type transistor or an enhancement FET. The first protection transistor 106 may also be referred to as a "normally off" transistor. In an example, the first protection transistor 106 is configured so that no conduction electrons (or conduction carriers) are available without a positive gate voltage at the gate terminal 124 of the first protection transistor 106. In other words, without the positive gate voltage at the gate terminal 124 of the first protection transistor 106, no electrical conductivity (and/or conductive channel) is established between the drain terminal 126 and the source terminal 128 of the first protection transistor 106. Without the positive gate voltage applied to the gate terminal 124 of the first protection transistor 106, the first protection transistor 106 turns off. On the other hand, if a positive gate voltage is applied to the gate terminal 124 of the first protection transistor 106, a conductive channel is formed between the drain terminal 126 and the source terminal 128.

As a result, an electric current may flow between the drain terminal 126 and the source terminal 128 via the conductive channel.

The Zener string 108 is coupled between the first terminal 112 and the gate terminal 124 of the first protection transistor 106. The Zener string 108 comprises at least one Zener diode 110. Along a direction of the Zener string 108 from the first terminal 112 to the gate terminal 124 of the first protection transistor 106, referred to as the string direction, the at least one Zener diode 110 may be arranged and/or integrated in a reverse direction in the Zener string 108.

In an example, the Zener string 108 and/or the at least one Zener diode 110 is configured such that a predefined breakthrough voltage exists. The breakthrough voltage may be 600V or having a value between 400V and 800V. If a voltage referred to as the string voltage is applied across the Zener string 108 (in the string direction) that has at least the value of the breakthrough voltage, the at least one Zener diode 110 changes from a blocking state to a conducting state. The greater the value of the string voltage above the breakthrough voltage, the more conductive the at least one Zener diode 110 becomes.

In an example, the Zener string 108 and/or the at least one Zener diode 110 is configured such that the predefined breakthrough voltage is defined such that the Zener string 108 changes to a (in reverse direction) conducting state if a voltage referred to as the circuit voltage between the first terminal 112 and the second terminals 114 reaches and/or exceeds a predefined circuit voltage reference value. As an effect, the (in reverse direction) conducting Zener string 108 may control the gate terminal 124 of the first protection transistor 106 so that the first protection transistor 106 changes to the conducting state. In an example, the Zener string 108 and/or the at least one Zener diode 110 is configured such that the breakthrough voltage is defined to control the first protection transistor 106 to a conducting state via the Zener string 108 if the circuit voltage between the first terminal 112 and the second terminal 114 reaches and/or exceeds the predefined circuit voltage reference value.

In an example, the Zener string 108 and/or the at least one Zener diode 110 is configured such that the breakthrough voltage is defined such that the Zener string 108 changes to a blocking state in the blocking direction if the circuit voltage between the first terminal 112 and the second terminal 114 falls below the predefined reference value. As an effect, the reverse-blocking Zener string 108 may control the gate terminal 124 of the first protection transistor 106 so that the first protection transistor 106 changes to the blocking state. In an example, the Zener string 108 and/or the at least one Zener diode 110 is configured such that the breakthrough voltage is defined to control the first protection transistor 106 to a blocking state via the Zener string 108 if the circuit voltage between the first terminal 112 and the second terminal 114 falls below the predefined circuit voltage reference value.

With reference to the circuit arrangement 180 of FIG. 2, the circuit voltage reference value may be set to, for example, a voltage value of the voltage source 152 and/or, for example, a voltage value that is up to a maximum of 20%, a maximum of 15%, or a maximum of 10% greater than the voltage value of the voltage source 152.

With respect to the circuit 100 of FIG. 2, reference is made to the preceding explanations, preferred features, technical effects and/or advantages in an analogous manner as explained for the circuit 100 of FIG. 1. However, the circuit 100 of FIG. 2 comprises the Zener string 108 and the first protection transistor 106, which together cause an oscillatory response of the transistor voltage V2 to be significantly lower following the time T1 and/or following the time T2. An example of the signal waveform of the transistor voltage V2 of the circuit 100 of FIG. 2 is shown schematically in FIG. 7.

As has already been explained in connection with FIG. 1, the control voltage V1 can change from the value C2 to the value C1 at time T2, so that the control transistor 104 changes from the conducting state to the blocking state at time T2. From FIG. 7, it can be seen that the signal waveform of transistor voltage V2 immediately after time T2 does not exhibit a particularly large oscillatory response. Rather, the maximum value K6 of the transistor voltage V2 following the time T2 is only slightly larger than the value K2 of the transistor voltage V2. Immediately following time T2, the transistor voltage V2 increases so that the circuit voltage between the first terminal 112 and the second terminal 114 also increases. In an example, the Zener string 108 and/or the at least one Zener diode 110 may be configured such that the string voltage reaches the predefined breakthrough voltage of the at least one Zener diode 110 if the transistor voltage V2 becomes greater than the value K2. As an effect, the first protection transistor 106 is set in the conductive state when the breakthrough voltage is reached. The first protection transistor 106 causes conduction between the first node 116 and the second terminal 114, and at the same time, the first control transistor 104 may be in the blocking state. Despite the blocking state of the first control transistor 104, the conductive connection established between the first node 116 and the second terminal 114 by the first protection transistor 106 may cause the power transistor 102 to also be (or continue to be) set in a conductive state. As a result, a conductive connection is established between the first terminal 112 and the second terminal 114 such that the transistor voltage V2 between the drain terminal 132 and the source terminal 134 is limited to the value K6. Due to the conductive connection between the first terminal 112 and the second terminals 114, the transistor voltage V2 decreases again after reaching the value K6. In an analogous manner, the circuit voltage between the first terminal 112 and the second terminal 114 will also decrease again. In an example, the decreasing circuit voltage may cause the string voltage to also decrease and reach a value less than the predefined breakthrough voltage of the at least one Zener diode 110. As an effect, the at least one Zener diode 110 changes back to the blocking state. As another effect, the first protection transistor 106 is also driven back to the blocking state when the at least one Zener diode 110 reaches the blocking state. The conductive connection between the first node 116 and the second terminal 114 previously caused by the first protection transistor 106 is again broken due to the blocking state of the first protection transistor 106. Provided the control transistor 104 is still in the blocking state, both the first protection transistor 106 and the control transistor 104 are in the blocking state. Depending on the oscillation behavior of the transistor voltage V2 and/or depending on the circuit voltage (between the first terminal 112 and the second terminal 114), the first protection transistor 106 can change between the blocking state and the conducting state in a controlled manner via the Zener string 108 in order to dampen a possible oscillation behavior of the transistor voltage V2 and/or the circuit voltage. In an analogous manner, the Zener string 108 and the first protection transistor 106 may serve to damp an oscillatory behavior of the transistor voltage and/or the circuit voltage immediately following the time T1.

Due to the advantageously damped oscillation behavior of the transistor voltage V2 and/or the circuit voltage with the help of the Zener string 108 and the first protection transistor 106, it is possible to reduce the cost and the size of the power transistor 102. In particular, it is then no longer necessary to ensure a large overvoltage rating of the power transistor 102. Instead, a small overvoltage rating may be sufficient for the power transistor 102, thereby reducing the cost and size of the power transistor 102. Due to the smaller size of the power transistor 102, a higher control speed of the power transistor 102 from the conducting state to the blocking state, and vice versa, can be achieved. In simple terms, the power transistor 102 becomes faster as its size decreases.

In an example, the size of the first protection transistor 106 is less than 50%, less than 40%, less than 10%, or less than 5% of the size of the control transistor 104.

Figure 3:
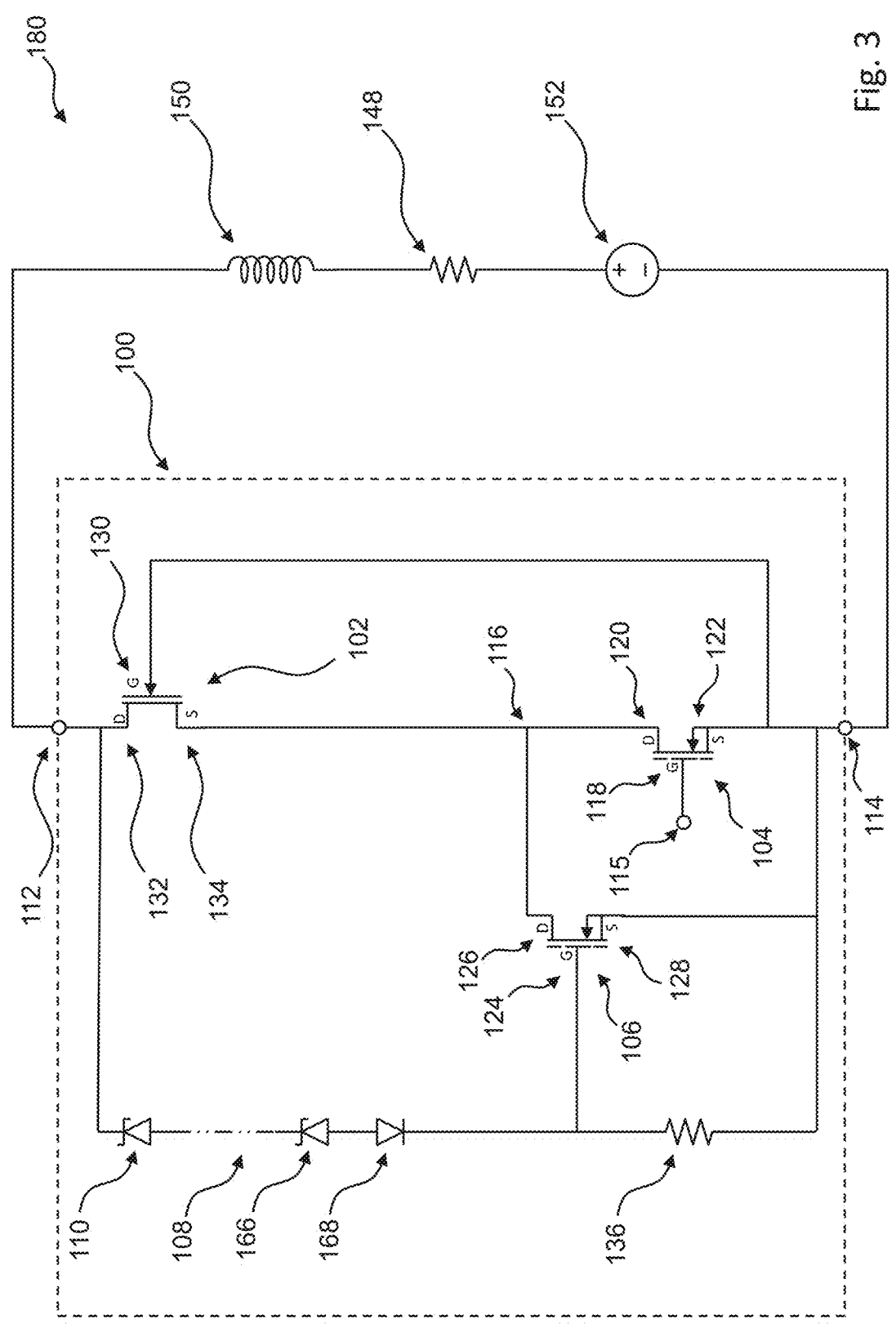

In FIG. 3, another example of an embodiment of the circuit 100 is shown schematically. For the circuit 100 of FIG. 3, reference is made to the preceding explanations, preferred features, technical effects and advantages in an analogous manner, which have been explained in connection with the circuit 100 of FIG. 2.

Compared to the circuit 100 of FIG. 2, the circuit 100 of FIG. 3 differs in particular by the Zener string 108. The Zener string 108 comprises a plurality of Zener diodes 110, 166. In particular, the plurality of Zener diodes 110, 166 are connected in series. Due to the series connection of the plurality of Zener diodes 110, 166, a common breakthrough voltage of the Zener string 108 may result, above which all Zener diodes 110, 166 simultaneously change from a blocking state to a conducting state. In the string direction from the first terminal 112 to the gate terminal 124, each Zener diode 110, 166 may be reverse-biased and/or integrated into the Zener string 108. The Zener string 108 may further comprise at least one (regular) diode 168. In an example, the Zener string 108 may comprise one (regular) diode 168 in particular associated with each Zener diode 110, 166. Each (regular) diode may have its respective forward direction in the string direction.

In an example, the Zener string 108 may comprise a plurality of Zener diodes 110, 166 arranged monolithically integrated with each other. In particular, each Zener diode 110, 166 is configured as a polysilicon Zener diode 110, 166 and/or is made of and/or with polysilicon.

In an example, the circuit 100 comprises a first electrical impedance 136. The first electrical impedance 136 may be coupled between the first protection transistor 106 and the second terminal 114. In an example, the first impedance 136 is coupled between a gate terminal 124 and the second terminal 114. The first electrical impedance 136 supports attenuation characteristics of the Zener string 108 and/or the first protection transistor 106.

In an example, the control transistor 104 and the first protection transistor 106 are monolithically integrated into a single semiconductor chip of the circuit 100. In particular, the monolithic integration may be enabled by having the drain terminal 126 of the first protection transistor 106 and the drain terminal 120 of the control transistor coupled to each other and/or to the first node 116. The monolithic integration of the two transistors 104, 106 may allow for a particularly small size of the circuit 100.

In an example, the control transistor 104, the first protection transistor 106 and the at least one Zener diode 110, 166 of the Zener string 108 are monolithically integrated in a single semiconductor chip of the circuit 100. The at least one Zener diode 110, 166 may be isolated from the control transistor 104 and/or the first protection transistor 106 in the semiconductor chip. By monolithically integrating the two transistors 104, 106 and the at least one Zener diode 110, 166, an even smaller size of the circuit 100 can be achieved.

However, it is also possible that the at least one Zener diode 110, 166 of the Zener string 108 is not monolithically integrated into the semiconductor chip, but that the at least one Zener diode 110, 166 is a discrete component.

In an example, the power transistor 102 is configured as a compound semiconductor transistor. The compound semiconductor may be selected and/or used in the transistor such that the power transistor 102 allows a high transistor voltage and a high drain-source current.

In an example, the power transistor 102 is configured as a gallium nitride, GaN, transistor. The power transistor 102 configured as a GaN transistor provides the advantage that the power transistor 102 allows a high transistor voltage and/or a high drain-source current while providing very fast switching times. In addition, the GaN transistor offers a small channel resistance. The small channel resistance allows the power transistor 102 to have a small package size, which also allows the circuit 100 to comprise a small package size.

In an example, the power transistor 102 is configured as a silicon carbide, SiC, transistor. A power transistor 102 configured as a SiC transistor offers the advantage that the power transistor 102 allows for a high transistor voltage and/or drain-source current, while also offering very fast switching times. In addition, the SiC transistor offers a small channel resistance. The small channel resistance allows the power transistor 102 to be small in size, which also allows the circuit 100 to comprise a small package size.

Figure 4:
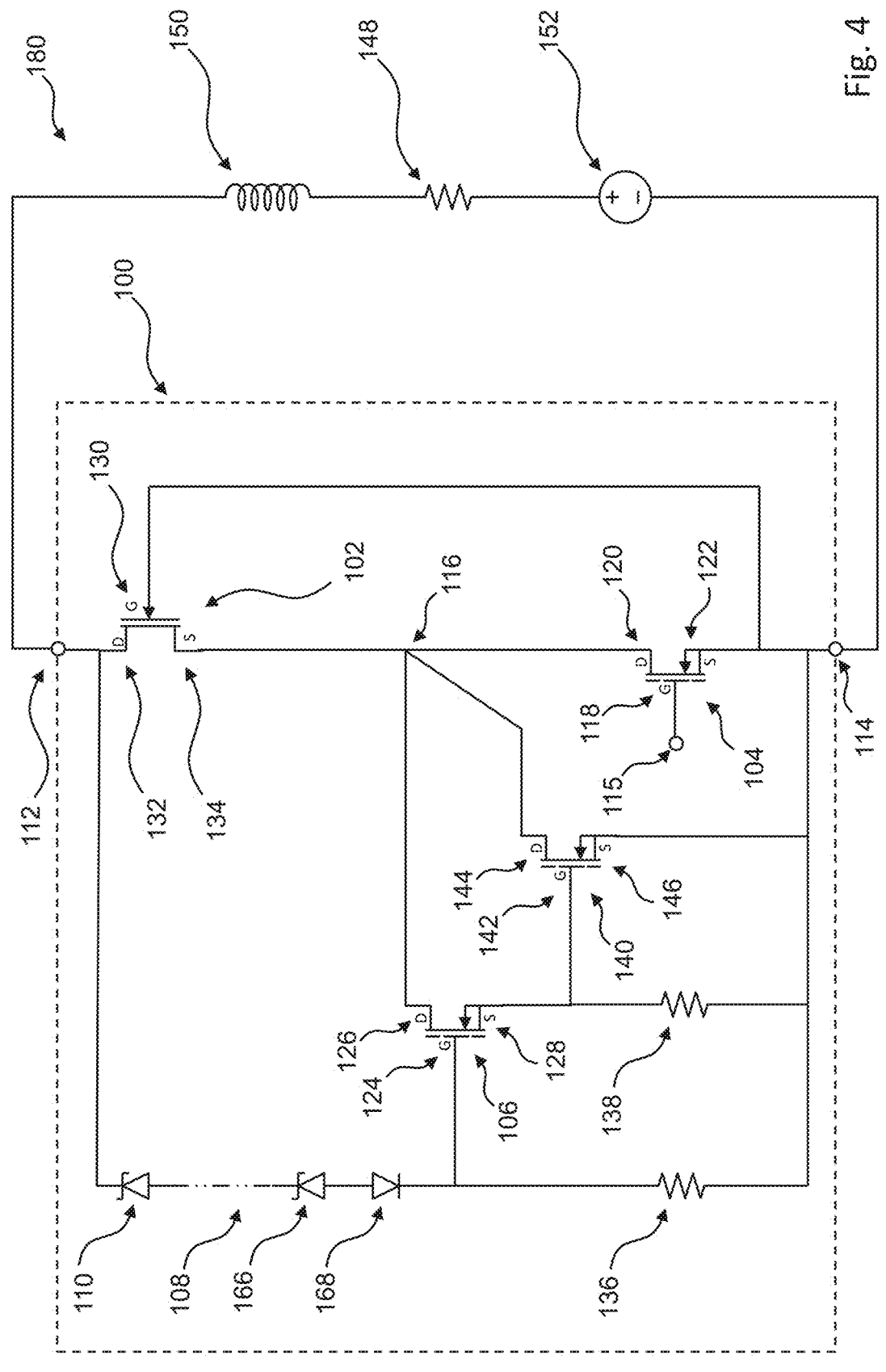

In FIG. 4, an example of a further embodiment of the circuit 100 is schematically shown. For the circuit 100 of FIG. 4, reference is made in an analogous manner to the advantageous explanations, advantageous features, technical effects and/or advantages as explained for the circuit 100 of FIG. 3.

In an example, the circuit 100 comprises another transistor 140 referred to as the second protection transistor 140. The second protection transistor 140 may be coupled between the first node 116 and the second terminal 114. In an example, the drain terminal 144 of the second protection transistor 140 is directly or indirectly electrically connected to the first node 116. In an example, the source terminal 146 of the second protection transistor 140 may be directly or indirectly electrically connected to the second terminal 114. In an example, the gate terminal 142 of the second protection transistor 140 may be directly or indirectly electrically connected to the source terminal 128 of the first protection transistor 106. The circuit 100 may further comprise a second electrical impedance 138. The second electrical impedance 138 may be coupled between the source terminal 128 (or the gate terminal 142) and the second terminal 114. In an example, the source terminal 128 and the gate terminal 142 may be directly electrically connected to each other. Both the source terminal 128 and the gate terminal 142 may be electrically connected (indirectly) to the second terminal 114 via the second electrical impedance 138.

The second protection transistor 140 may be a self-blocking transistor, in particular a silicon self-blocking transistor. Further, the second protection transistor 140 may be configured as a field effect transistor. In an example, the second protection transistor 140 is configured and/or referred to as an enhancement type transistor or an enhancement FET. The second protection transistor 140 may also be referred to as a "normally off" transistor. In an example, the second protection transistor 140 is configured so that no conduction electrons (or conduction carriers) are available without a positive gate voltage at the gate terminal 142 of the second protection transistor 140. In other words, without the positive gate voltage at the gate terminal 142 of the second protection transistor 140, no electrical conductivity (and/or conductive channel) is established between the drain terminal 144 and the source terminal 146 of the second protection transistor 140. Without the positive gate voltage applied to the gate terminal 142 of the second protection transistor 140, the second protection transistor 140 turns off. On the other hand, if a positive gate voltage is applied to the gate terminal 142 of the second protection transistor 140, a conductive channel is established between the drain terminal 144 and the source terminal 146. As a result, an electric current may flow between the drain terminal 144 and the source terminal 146 via the conductive channel.

The first protection transistor 106 and/or second protection transistor 140 may be coupled in a Darlington arrangement. As an effect, the current through the Zener string 108 to control the first protection transistor 106 can be kept small, at least relative to the second protection transistor 140. In addition, the Darlington arrangement of the first protection transistor 106 and the second protection transistor 140 provides the advantage that a conductive connection can be made across the second protection transistor 140 particularly quickly after the at least one Zener diode 110, 166 has changed to the conductive state. In an example, the Zener string 108 comprises a plurality of Zener diodes 110, 166. The plurality of Zener diodes 110, 166 can create a corresponding series resistance through the Zener string 108 that makes it difficult to quickly change a state of the second protection transistor 140. In one example, the size of the first protection transistor 106 is less than 50%, less than 40%, less than 30%, or less than 20% of the size of the second protection transistor 140. The drain terminal 144 of the second protection transistor 144 may be electrically connected directly to the first node 116 and the source terminal 146 may be electrically connected directly to the second terminal 114, such that the second protection transistor 140 may serve at least substantially to damp the oscillatory response immediately following the time point T1 and/or immediately following the time point T2. Because of the two electrical impedances 136, 138, the first protection transistor 106 in the example of FIG. 4 may serve at least substantially to control the second protection transistor 140. If the first protection transistor 106 comprises a smaller size, in particular a significantly smaller size, than the second protection transistor 140, the Zener string 108 may cause a fast control response of the first protection transistor 106 and therefore a fast control response of the second protection transistor 140 despite the potentially large series resistance.

In an example, the control transistor 104, the first protection transistor 106, and the second protection transistor 140 are monolithically integrated into a single semiconductor chip of the circuit 100. In particular, the monolithic integration may be enabled by having the drain terminal 126 of the first protection transistor 106, the drain terminal 144 of the second protection transistor 140, and the drain terminal 120 of the control transistor 104 coupled to each other and/or to the first node 116. The monolithic integration of the three transistors 104, 106, 140 allows for a particularly small size of the circuit 100.

In an example, the control transistor 104, the first protection transistor 106, the second protection transistor 140, and the at least one Zener diode 110, 166 of the Zener string 108 are monolithically integrated in a single semiconductor chip of the circuit 100. The at least one Zener diode 110, 166 may be isolated from the control transistor 104, the first protection transistor 106 and/or the second protection transistor 140 in the semiconductor chip. By monolithically integrating the three transistors 104, 106, 140 and the at least one Zener diode 110, 166, an even smaller size of the circuit 100 can be achieved.

However, it is also possible that the at least one Zener diode 110, 166 of the Zener string 108 is not monolithically integrated into the semiconductor chip, but that the at least one Zener diode 110, 166 is a discrete component.

In an example, the control transistor 104, the first protection transistor 106, and/or the second protection transistor 140 may be LFETs. The LEFs configuration may allow and/or support the construction of the Zener diodes 110, 166 from or with polysilicon, in an example.

FIG. 9 schematically illustrates an example of an embodiment of the method 200. The method 200 refers to a method for the circuit 100, wherein the method comprises the steps of:

a) driving the gate terminal of the control transistor via the third terminal so that the control transistor becomes conducting and sets the circuit in a state referred to as on state, b) driving the gate terminal of the control transistor via the third terminal so that the control transistor becomes blocking and sets the circuit in a state referred to as off state, and d) driving the gate terminal of the protection transistor via the Zener string, if a voltage across the Zener string exceeds a reverse voltage predefined by the at least one Zener diode, so that the protection transistor becomes conducting and sets and/or maintains the circuit in a state referred to as a protection state.

For the method 200, reference is made to the preceding explanations, preferred features, technical effects and advantages in an analogous manner as explained in connection with the circuit 100, the circuit arrangement 180 and/or the device 153.

Although the described exemplary embodiments disclosed herein focus on devices, systems, and methods for using same, the present disclosure is not necessarily limited to the example embodiments illustrate herein.

The systems and methods described herein may at least partially be embodied by a computer program or a plurality of computer programs, which may exist in a variety of forms both active and inactive in a single computer system or across multiple computer systems. For example, they may exist as software program(s) comprised of program instructions in source code, object code, executable code or other formats for performing some of the steps. Any of the above may be embodied on a computer-readable medium, which may include storage devices and signals, in compressed or uncompressed form.

It is noted that the embodiments above have been described with reference to different subject-matters. In particular, some embodiments may have been described with reference to method-type claims whereas other embodiments may have been described with reference to apparatus-type claims. However, a person skilled in the art will gather from the above that, unless otherwise indicated, in addition to any combination of features belonging to one type of subject-matter also any combination of features relating to different subject-matters, in particular a combination of features of the method-type claims and features of the apparatus-type claims, is considered to be disclosed with this document.

Furthermore, it is noted that the drawings are schematic. In different drawings, similar or identical elements are provided with the same reference signs. Furthermore, it is noted that in an effort to provide a concise description of the illustrative embodiments, implementation details which fall into the customary practice of the skilled person may not have been described. It should be appreciated that in the development of any such implementation, as in any engineering or design project, numerous implementation-specific decisions must be made in order to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill.

Finally, it is noted that the skilled person will be able to design many alternative embodiments without departing from the scope of the appended claims. In the claims, any reference sign placed between parentheses shall not be construed as limiting the claim. The word "comprise(s)" or "comprising" does not exclude the presence of elements or steps other than those listed in a claim. The word "a" or "an" preceding an element does not exclude the presence of a plurality of such elements. Measures recited in the claims may be implemented by means of hardware comprising several distinct elements and/or by means of a suitably programmed processor. In a device claim enumerating several means, several of these means may be embodied by one and the same item of hardware. The mere fact that certain measures are recited in mutually different dependent claims does not indicate that a combination of these measures cannot be used to advantage.

Unless stated otherwise, terms such as "first", "second", etc. are used to arbitrarily distinguish between the elements such terms describe. Thus, these terms are not necessarily intended to indicate temporal or other prioritization of such elements.

The invention claimed is:

1. A circuit comprising:

a self-conducting transistor referred to as power transistor, a further transistor referred to as control transistor, a second further transistor referred to as first protection transistor, and a string referred to as a Zener string, which comprises at least one Zener diode, wherein the power transistor is coupled between a first terminal of the circuit and a first node of the circuit, wherein the control transistor is coupled between the first node and a second terminal of the circuit, wherein a gate terminal of the control transistor is coupled to a third terminal of the circuit, wherein the first protection transistor is coupled between the first node and the second terminal, and wherein the Zener string is coupled between the first terminal and a gate terminal of the first protection transistor.

2. The circuit according claim 1, wherein the power transistor is a gallium nitride transistor, a silicon carbide transistor or another compound semiconductor transistor.

3. The circuit according to claim 1, wherein the control transistor and the first protection transistor are monolithic.

4. The circuit according to claim 1, wherein the control transistor, the first protection transistor and the at least one Zener diode are monolithic.

5. The circuit according to claim 1, wherein the drain terminal of the power transistor is coupled to the first terminal, and wherein the source terminal of the power transistor is coupled to the first node.

6. The circuit according to claim 1, wherein the gate terminal of the power transistor is coupled to the second terminal.

7. The circuit according to claim 1, wherein the drain terminal of the control transistor is coupled to the first node, and wherein a source terminal of the control transistor is coupled to the second terminal.

8. The circuit according to claim 1, wherein at least one of the control transistor and the first protection transistor is a self-blocking transistor, in particular a silicon, Si, self-blocking transistor.

9. The circuit according to claim 1, wherein the drain terminal of the first protection transistor is coupled to the first node, and wherein the source terminal of the first protection transistor is coupled to the second terminal.

10. The circuit according to claim 1, wherein the source terminal of the first protection transistor is coupled to the second terminal via at least a first electrical impedance.

11. The circuit according to claim 1, wherein the gate terminal of the first protection transistor is coupled to the second terminal at least via a second electrical impedance.

12. The circuit according to claim 1, wherein the circuit comprises a third further transistor referred to as second protection transistor, wherein the second protection transistor is coupled between the first node and the second terminal, and wherein the gate terminal of the second protection transistor is coupled to the source terminal of the first protection transistor.

13. The circuit according to claim 1, wherein the drain terminal of the second protection transistor is coupled to the first node, and wherein the source terminal of the second protection transistor is coupled to the second terminal.

14. The circuit according to claim 1, wherein the second protection transistor is a self-blocking transistor, in particular a self-blocking silicon, Si, transistor.

15. The circuit of claim 1, wherein the circuit comprises a third further transistor referred to as second protection transistor, wherein the second protection transistor is coupled between the first node and the second terminal, and wherein the gate terminal of the second protection transistor is coupled to the source terminal of the first protection transistor, wherein the drain terminal of the second protection transistor is coupled to the first node, and wherein the source terminal of the second protection transistor is coupled to the second terminal.

16. The circuit of claim 1, wherein the circuit comprises a third further transistor referred to as second protection transistor, wherein the second protection transistor is coupled between the first node and the second terminal, and wherein the gate terminal of the second protection transistor is coupled to the source terminal of the first protection transistor, wherein the second protection transistor is a self-blocking transistor, in particular a self-blocking silicon, Si, transistor, wherein the drain terminal of the second protection transistor is coupled to the first node, and wherein the source terminal of the second protection transistor is coupled to the second terminal, wherein the second protection transistor is a self-blocking transistor, in particular a self-blocking silicon, Si, transistor.

17. The circuit of claim 1, wherein the power transistor is a gallium nitride transistor, a silicon carbide transistor or another compound semiconductor transistor, wherein the drain terminal of the power transistor is coupled to the first terminal, and wherein the source terminal of the power transistor is coupled to the first node, wherein the gate terminal of the power transistor is coupled to the second terminal, wherein the drain terminal of the control transistor is coupled to the first node, and wherein a source terminal of the control transistor is coupled to the second terminal, wherein at least one of the control transistor and the first protection transistor is a self-blocking transistor, in particular a silicon, Si, self-blocking transistor, wherein the drain terminal of the first protection transistor is coupled to the first node, and wherein the source terminal of the first protection transistor is coupled to the second terminal.

18. A method for a circuit comprising a self-conducting power transistor, a further transistor referred to as control transistor, a second further transistor referred to as first protection transistor, and a string referred to as Zener string comprising at least one Zener diode, wherein the power transistor is a gallium nitride transistor or a silicon carbide transistor, wherein the power transistor is coupled between a first terminal of the circuit and a first node of the circuit, wherein the control transistor is coupled between the first node and a second terminal of the circuit, wherein a gate terminal of the control transistor is coupled to a third terminal of the circuit, wherein the first protection transistor is coupled between the first node and the second terminal, and wherein the Zener string is coupled between the first terminal and a gate terminal of the first protection transistor, and wherein the method comprises the steps of:
  a) driving the gate terminal of the control transistor via the third terminal so that the control transistor becomes conducting and sets the circuit in a state referred to as on state,
  b) driving the gate terminal of the control transistor via the third terminal so that the control transistor becomes blocking and sets the circuit in a state referred to as off state, and
  c) driving the gate terminal of the protection transistor via the Zener string, if a voltage across the Zener string exceeds a reverse voltage predefined by the at least one Zener diode, so that the protection transistor becomes conducting and sets and/or maintains the circuit in a state referred to as a protection state.

\* \* \* \* \*